United States Patent [19]

Otani et al.

[11] Patent Number: 5,186,811
[45] Date of Patent: Feb. 16, 1993

[54] METHOD OF MANUFACTURING PRINTED WIRING BOARDS

[75] Inventors: Yasuaki Otani; Toichi Takishima; Yasuhiko Sakata, all of Saitama, Japan

[73] Assignee: Nippon CMK Corp., Japan

[21] Appl. No.: 869,332

[22] Filed: Apr. 15, 1992

[30] Foreign Application Priority Data

Apr. 18, 1991 [JP] Japan .................. 3-114132

[51] Int. Cl.$^5$ ............................... C25D 5/02
[52] U.S. Cl. .................................... 205/125
[58] Field of Search .................... 205/122, 125

[56] References Cited

U.S. PATENT DOCUMENTS 4,973,380 11/1990 Pryor .................... 204/130

Primary Examiner—T. M. Tufariello
Attorney, Agent, or Firm—Bruce L. Adams; Van C. Wilks

[57] ABSTRACT

The present invention aims to stabilize the plating film and to even the thickness thereof in the case where through holes of printed wiring boards are subjected to copper plating.

Copper recovered from the etching waste liquor produced in the general manufacture of the printed wiring boards is supplied from a powder feeder 21 into a dissolution tank 23 to obtain a copper ion solution. For the copper plating, a substrate 1 acting as a cathod is arranged facing anodes 28 within a plating tank 26. The dissolution tank 23 supplies the copper ion solution into a plating tank 26 to maintain at a predetermined value the concentration of copper ions of a plating solution 27. This allows the insoluble polar plate to be used as the anodes 28, which leads to a stable current density.

2 Claims, 5 Drawing Sheets

METHOD OF MANUFACTURING PRINTED WIRING BOARDS

BACKGROUND OF THE INVENTION

1. Field of the Invention

The present invention relates to a method of manufacturing printed wiring boards in which through holes or other portions of substrates are to be plated with copper to obtain printed wiring boards.

2. Description of the Related Arts

For manufacture of printed wiring boards, copper plating layers are imparted on the insides of through holes provided in substrates, to thereby ensure the electrical conduction to lands and patterns formed on top and bottom surfaces of the substrates. FIGS. 4 to 7 show a general process for the copper plating of the through holes. A through hole 4 is formed at a desired position of a copper-clad laminate 1 (or a substrate 1) consisting of a substrate 2 made of glass epoxy, paper epoxy bakelite, polyimide paper phenol or the like, and copper foils 3 clad on the top and bottom surfaces of the substrate 2. The copper-clad laminate 1 is chemically plated to form a copper film 5 having a thickness of 0.2 to 1 $\mu$m, as shown in FIG. 4. The copper film 5 is evenly formed across the entire inner surface of the through hole 4 from both surfaces of the substrate 1 as shown in FIG. 5. Thus processed substrate 1 is disposed as a cathode in a plating tank for executing copper plating treatment. This copper plating process allows a copper plating layer 6 to be formed over both the surfaces and the inside of the through hole 4 of the substrate 1 as shown in FIG. 6. Subsequent to the above copper plating process, a predetermined regions of both the surfaces of the substrate 1 are etched to remove the corresponding copper plating layer 6 provided on the surfaces of the substrate 1 with a copper plating layer 7 remaining within the through hole 4, thereby electrically conducting the top and bottom copper foils 3 of the substrate 1 to each other by way of the copper plating layer 7 as shown in FIG. 7.

FIG. 8 shows a conventional process for executing the above copper plating. A plating tank 10 is filled with a copper sulfate solution acting as a plating solution 11 into which the substrate 1 illustrated in FIG. 5 is immersed. The substrate 1 is connected to a negative terminal of a D. C. power source 12 to form a cathode and is interposed between anodes 13 each comprising a titanium basket 14 having a multiplicity of ball-like phosphorous containing copper 15 tightly loaded therein, each basket 14 being sheathed in an anode bag 16. In order to plate the substrate 1 under this condition the plating solution 11 is electrolyzed to deposit the copper ion in the plating solution onto the substrate 1 in the form of metallic copper. During the electrolysis the phosphorus containing copper 15 is dissolved to supply copper ions into the plating solution 11, thereby maintaining the concentration of the copper ions at a predetermined value.

In the copper plating treatment described above, however, it is difficult to evenly load the phosphorus into the titanium basket. Moreover, the current density of the anodes is impossible to keep constant due to the deformation thereof arising from electrolysis, which results in an uneven thickness of plating film. In addition, the decomposition and dissolution of the constituent of the phosphorus copper brings about an increase in the concentration of impurities in the plating solution, which contaminates the plating solution and leads to the formation of black film onto the surface of the anodes. This necessitates frequent replacement of the plating solution as well as a strict control of the plating solution so as to procure the solid state property of the plating film.

SUMMARY OF THE INVENTION

It is therefore the object of the present invention to overcome the above problems arising from the use of phosphorous copper and to provide a method of manufacturing printed wiring boards capable of ensuring a satisfactory copper plating onto the substrate.

As a result of investigation devotedly performed by the inventor to attain the above object, it has been found, with an attention to the general manufacturing process of printed wiring boards in which circuit patterns, lands and the like are formed on a copper-clad laminate, that etching waste liquor used in etching process of the manufacture is subjected to a predetermined treatment to recover copper, and that the recovered copper is reused as a copper ion supply source during the plating of the substrate, thereby enabling a satisfactory copper plating film to be formed under a simple control. The present invention has been thus completed.

In other words, the method of manufacturing printed wiring boards according to the present invention comprises the steps of recovering a copper compound by neutralizing etching waste liquor used in etching process for the manufacture of the printed wiring boards, dissolving the copper compound into a copper ion solution, and using the copper ion solution as a copper ion supply source in copper plating process of the printed wiring boards.

In the above constitution, the copper present in the etching waste liquor produced in the general etching process of manufacturing printed wiring boards is reused as an ion supply source for the plating solution. Accordingly the recycling of resources becomes possible and the phosphorous copper need not to be used as a copper ion supply source. Also, since the copper ion is supplied into the plating solution in the form of solution, the concentration of the copper ion within the plating solution is evened out and stabilized, which enables unchanging formation of the copper plating film.

BRIEF DESCRIPTION OF THE INVENTION

DESCRIPTION OF THE PREFERRED EMBODIMENTS

EXAMPLE 1

An example of the present invention will now be described with reference to the accompanying drawings.

Figure 1:
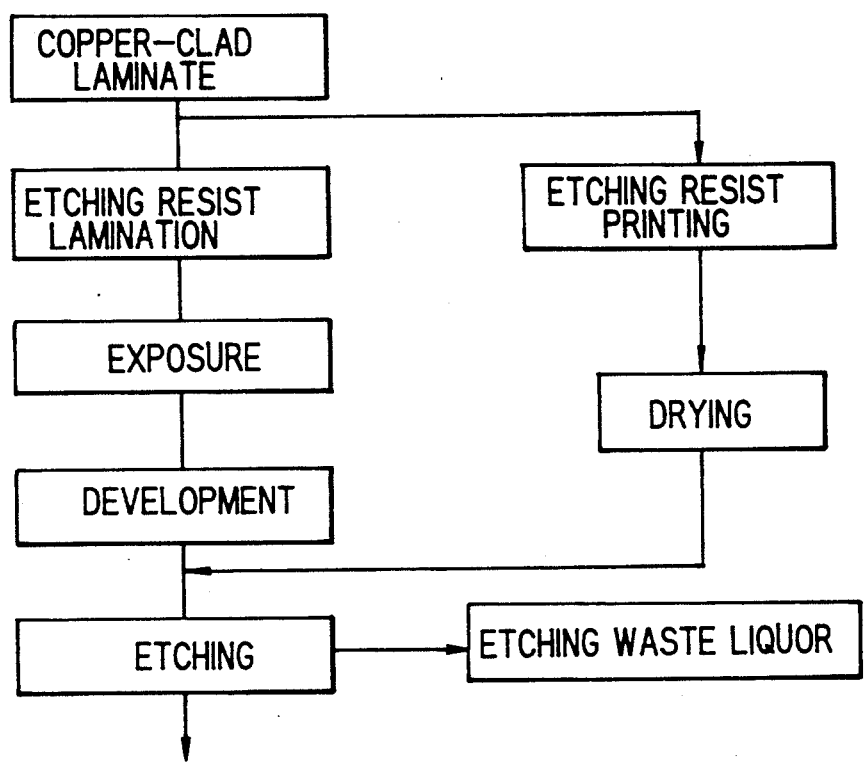
FIG. 1 is a flow sheet showing a general process for the manufacture of printed wiring boards.

The present invention is intended to recover copper from etching waste liquor used in an etching process for manufacturing printed wiring boards and recycle the recovered copper for copper plating of the printed wiring boards. FIG. 1 illustrates a general process of manufacturing printed wiring boards. A photo-etching resist is applied to a copper-clad laminate consisting of an insulating substrate such as glass-epoxy resin clad with copper foil, and then is subjected to a pattern exposure through a negative film. The exposed region of the photo-etching resist is hardened by the exposure, whereas the unexposed region of the photo-etching resist is removed by means of a development. Alternatively, the etching resist may be dried after a pattern restraint, and a region of the copper foil from which the photo-etching resist has been cleared may be fused by etching using an etching solution such as hydrochloric acid or hydrogen peroxide, in order to leave only the copper foil corresponding to the exposed portion. The etching waste liquor used in this etching is reused for copper ion supply as described later. After the completion of the etching process, a solder resist printing and a variety of treatments required for the formation of a shielding layer are carried out to produce the printed wiring boards.

Figure 2:
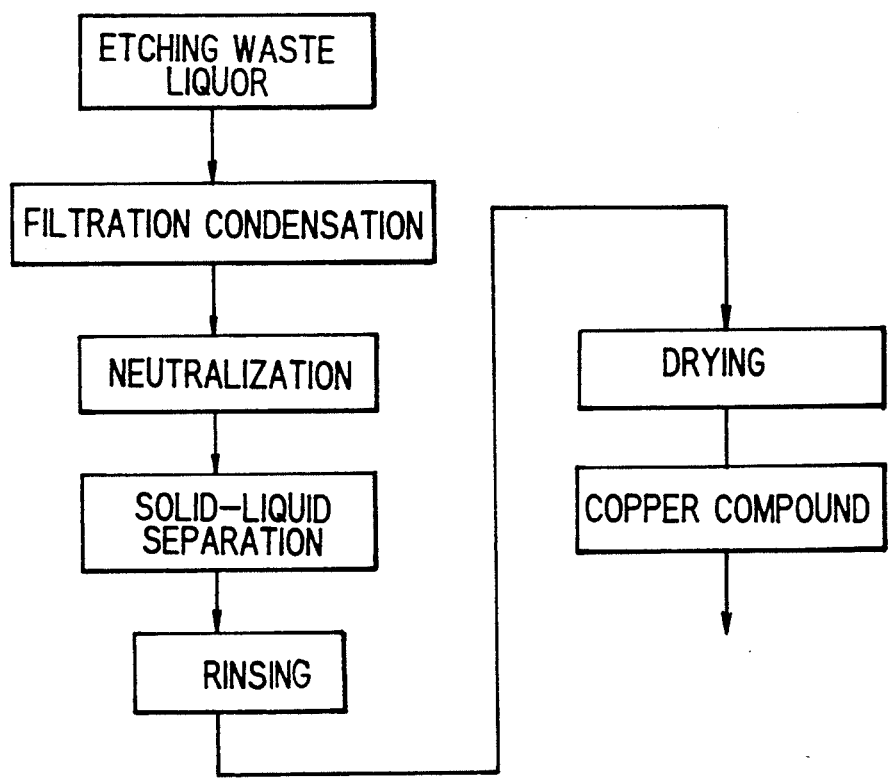
FIG. 2 is a flow sheet showing a process for the recovery of copper from etching waste liquor.

The present invention is directed to recover copper from etching waste liquor produced in the etching process during the common manufacture of printed wiring boards as described above. FIG. 2 shows procedures for the recovery of copper. The etching waste liquor including cupric chloride ($CuCl_2$), hydrogen peroxide and hydrochloric acid is filtered to remove solid content, and the filtrate is thickened by heat. The obtained etching waste liquor is then neutralized through the dosage of sodium carbonate. Formula 1 represents a neutralization equation in this case. The copper in the etching waste liquor is recovered in the form of insoluble green basic copper carbonate ($CuCO_3 \cdot Cu(OH)_2 \cdot nH_2O$).

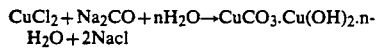
$$CuCl_2 + Na_2CO + nH_2O \rightarrow CuCO_3 \cdot Cu(OH)_2 \cdot nH_2O + 2NaCl$$

After the neutralization, solid-liquid separation is effected by means of filtration or centrifugation to separate the basic copper carbonate. The separated basic copper carbonate is then rinsed several times to remove sodium chloride which is a by-product, and dried to finally obtain a powdered basic copper carbonate.

The basic copper carbonate thus obtained from the etching waste liquor is subsequently dissolved in a specified amount of sulfuric acid, and the obtained copper sulfate solution is supplied as a copper ion supply source into a substrate plating tank.

Figure 3:
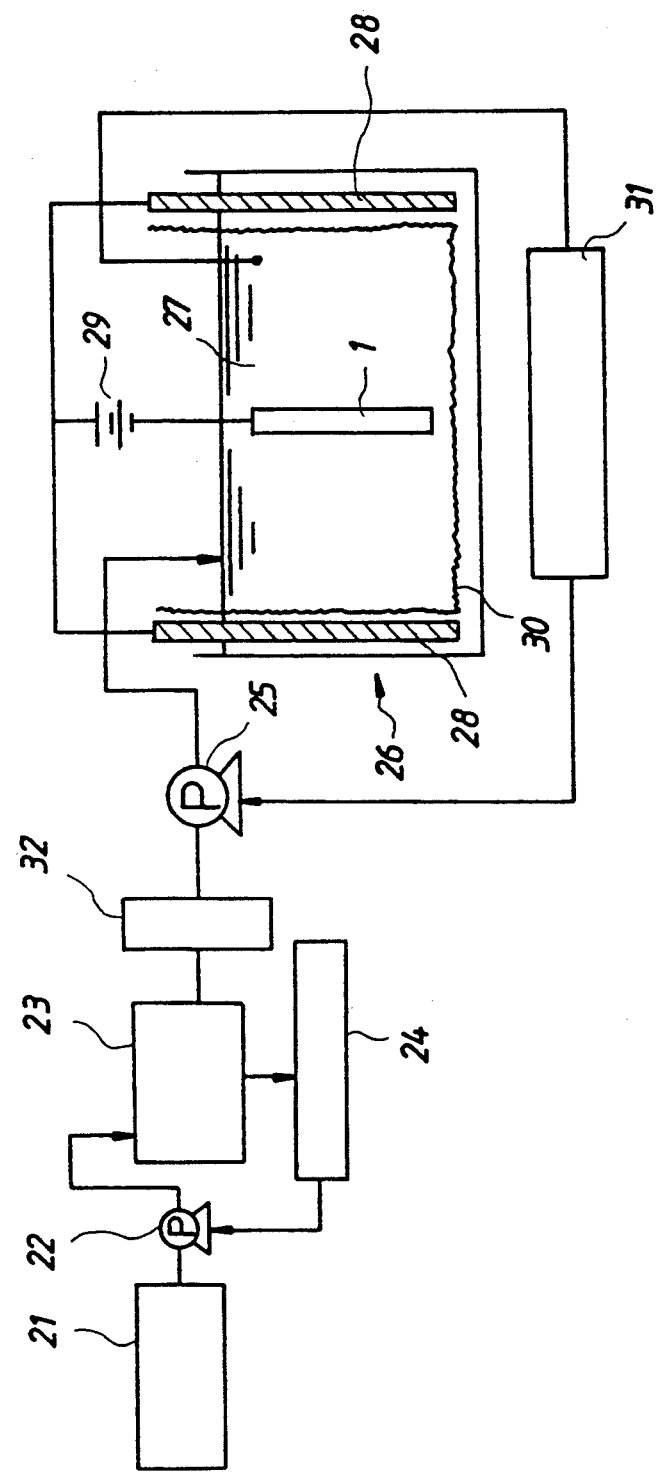
FIG. 3 is a block diagram illustrating the plating process.
Figure 4:
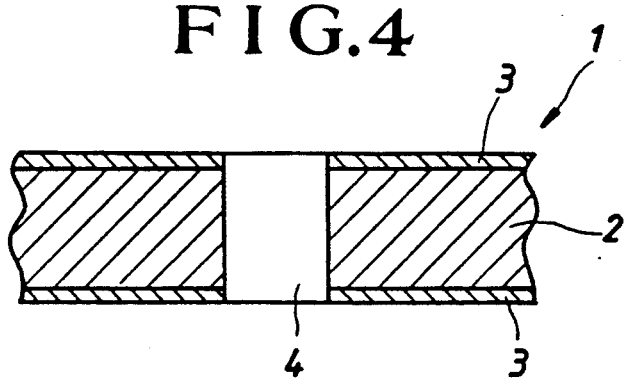
FIG. 4 is a sectional view of a copper-clad laminate with a through hole by way of example.

FIG. 3 diagramatically shows a configuration of such plating process, in which basic copper carbonate powder reserved in a powder feeder 21 is fed into a dissolution tank 23 through the drive of a pump 22. Since sulfuric acid is stored in the dissolution tank 23, the supplied basic copper carbonate is dissolved into a copper sulfate. A copper ion concentration within the dissolution tank 23 is automatically detected at any time by a copper concentration analyzer 24 which is interlocked with the pump 22 so that the copper ion concentration within the dissolution tank 23 can be kept at a predetermined value. The copper sulfate solution whose copper ion concentration lies at the predetermined value in this manner is supplied into a plating tank 26 with the aid of a pump 25.

Figure 5:
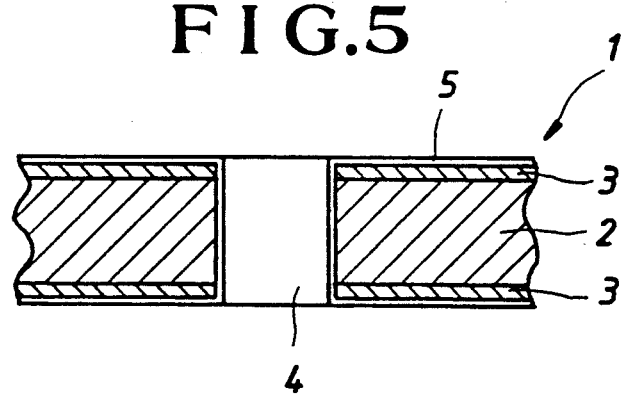
FIG. 5 is a sectional view of the first process for plating the through-hole.
Figure 6:
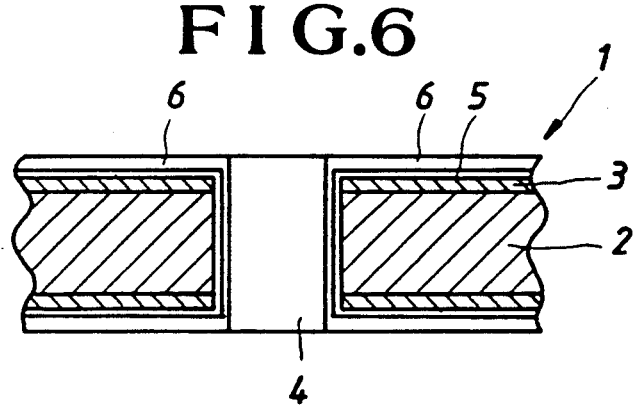
FIG. 6 is a sectional view of the second process for plating the through-hole.
Figure 7:
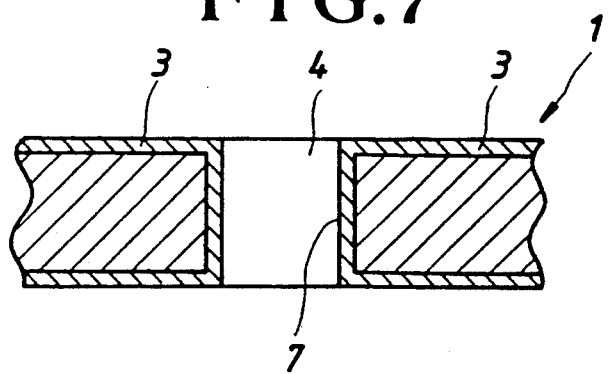
FIG. 7 is a sectional view of the third process for plating the through-hole.
Figure 8:
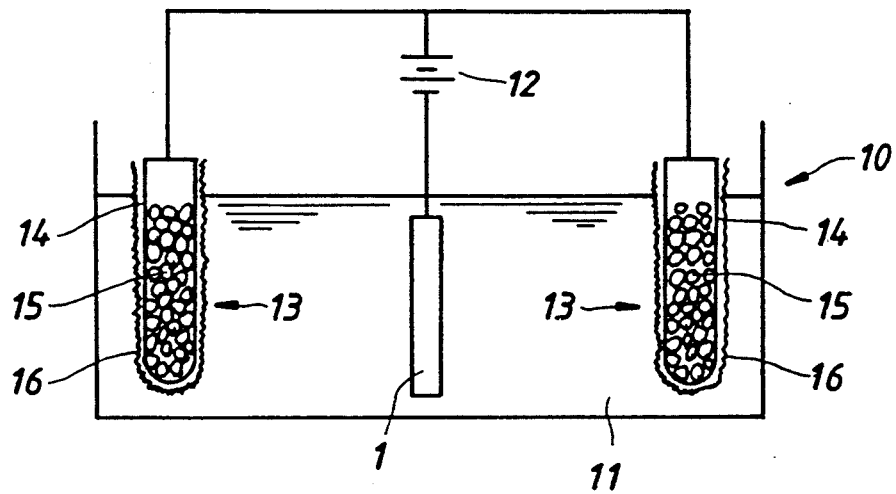
FIG. 8 is a block diagram showing the conventional plating process.

The plating tank 26 is filled with the copper sulfate solution acting as a plating solution 27 and has a substrate 1 and anodes 28 immersed therein. The substrate 1 is connected with a negative terminal of a D.C. power source 29 to serve as a cathode on which a metallic copper is electro-deposited by virtue of the electrolysis of the plating solution 27. In this case, as the substrate 1 there is used a substrate clad with copper film 5 to promote an electrical conductivity as shown in FIG. 5. The anodes 28 are spearated from the substrate 1 by a liquid permeable membrane 30 which prevents a brightener mixed into the plating solution 27 from adhering to the surface of the anodes 28, and which may be, for example, an ion-exchange neutral membrane made of Kanekalon, Saran, Pyren, Teflon and the like. Such plating tank 26 is provided with a copper concentration detector 31 which automatically detects a concentration of copper ions in the plating solution 27. In accordance with the value detected by the detector 31, the pump 25 for supplying the plating tank 26 with the copper sulfate solution in the dissolution tank 23 is actuated to thereby supply the copper sulfate solution in such a manner that the copper ion concentration within the plating tank 26 lies at a predetermined value. The following are, by way of example, plating conditions employed in the plating tank 26. It is to be noted that the plating conditions are determined for the substrate 1 subjected to a copper plating of 25 um thick.

| | |
|---|---|
| Basic copper carbonate | 40 g/l |
| Sulfuric acid | 180 g/l |
| Brightener | Proper amount |
| Cathode current density | 5A/dm$^2$ |
| Temperature | 20° C. |
| Time | 20 min. |

In the above configuration, the copper recovered from the etching waste liquor is supplied into the plating tank 26 as the copper ion supply source during the plating, to thereby ensure that the copper ion concentration in the plating solution 27 is at all times kept constant. This eliminates the need for use of ball-like soluble phosphorous copper which supplies copper ions as the anodes 28, and makes it possible to use insoluble plate-like electrodes made of platinum/titanium, iridium oxide/methane, ruthenium oxide/titanium or the like. The surface areas of the anodes 28 are therefore invariable, so that the current density of the anodes can be kept constant, thus resulting in a stable current density. This ensures a uniform deposit thickness, prevents the inclusion of impurities into the plating solution and the production of black film, and eliminates the necessity of troublesome exchange of the plating solution. Also, the stable current density enables the current density to be doubled for plating, thereby halving the required plating time. Moreover, a uniform and stable copper ion concentration within the plating solution ensures an easy control of the plating conditions. Furthermore, the reuse of the copper within the etching waste liquor as copper ion supply source allows the saving of copper through its recycling.

The utility of the present embodiment will next be described based on concrete numerical values.

(1) A stainless steel plate having a thickness of 2 mm and a length and width each of 200 mm was plated with 50 μm thick copper, and the deposited copper plating film was peeled off for tensile testing. It was found that this copper plating film presents and elongation of 16.2 to 26.4%, which is superior to the elongation of 10 to 18% observed in the conventional plating process using phosphorus containing copper. An extension force of the copper plating film is 33 to 38 Kgf/mm, which is stabler than that in the conventional process of 30 to 35 Kgf/mm.

(2) A through-hole of 0.35 diameter was provided in a 35 mm thick substrate for plating, and a throwing power of the film plated inside the through-hole was examined. The results were that the conventional process presents a 60% throwing power while this embodiment presents an 80% throwing power which is rather high.

(3) Two through-holes of 0.6 mm and 0.8 mm in diameter, respectively, were provided in a copper-clad laminate consisting of a 1.6 mm thick insulating substrate having top and bottom surfaces clad with a 18 um thick copper foil. The copper-clad laminate was plated with a copper plating of 25 μm thickness, and then subjected to a thermal cycle test, solder dip test, and mounting test. The obtained results were satisfactory and reliable.

In the above description, copper within the etching waste liquor was recovered as a basic carbonate, but instead it may be recovered in the form of a copper oxide or other copper compounds in the present invention. Also, the present invention may be applied for plating the portions except through-holes.

According to the present invention, the copper recovered from etching waste liquor produced in general manufacturing process of printed wiring boards is used in the form of copper ion solution as a copper ion supply source for the copper plating of printed wiring boards, to thereby allow the use of insoluble anodes, which ensures the formation of a stable plating film having an even thickness, and easy control and operation during the plating.

What is claimed is:

1. A method of manufacturing printed wiring boards, comprising the steps of:
   recovering a copper compound by neutralizing etching waste liquor produced in etching process for the manufacture of printed wiring boards;
   dissolving said copper compound into a copper ion solution; and
   using said copper ion solution as a copper ion supply source for copper plating process of the printed wiring boards.

2. A method of manufacturing printed wiring boards according to claim 1, wherein said copper ion solution is used to plate through holes of the printed wiring boards.

* * * * *